US012653042B2

(12) United States Patent
Saito et al.

(10) Patent No.: US 12,653,042 B2
(45) Date of Patent: Jun. 9, 2026

(54) SEMICONDUCTOR MODULE, SEMICONDUCTOR DEVICE, AND VEHICLE

(71) Applicant: FUJI ELECTRIC CO., LTD., Kawasaki (JP)

(72) Inventors: Mai Saito, Kawasaki (JP); Yoko Nakamura, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 387 days.

(21) Appl. No.: 18/526,144

(22) Filed: Dec. 1, 2023

(65) Prior Publication Data

US 2024/0112991 A1 Apr. 4, 2024

Related U.S. Application Data

(63) Continuation of application No. PCT/JP2022/039305, filed on Oct. 21, 2022.

(30) Foreign Application Priority Data

Dec. 24, 2021 (JP) ................................. 2021-210859

(51) Int. Cl.
*H10W 72/30* (2026.01)
*H10W 70/40* (2026.01)
(Continued)

(52) U.S. Cl.
CPC ....... *H10W 70/468* (2026.01); *H10W 70/427* (2026.01); *H10W 90/00* (2026.01);
(Continued)

(58) Field of Classification Search
CPC . H02M 7/003; H10W 40/255; H10W 70/468; H10W 70/427; H10W 70/466;
(Continued)

(56) References Cited

U.S. PATENT DOCUMENTS

| | | | | |
|---|---|---|---|---|
| 9,899,345 | B2 * | 2/2018 | Fujino | ................. H10W 72/072 |
| 11,476,225 | B2 * | 10/2022 | Takeda | ................ H10W 90/701 |

(Continued)

FOREIGN PATENT DOCUMENTS

| | | |
|---|---|---|
| JP | 2001-127100 A | 5/2001 |
| JP | 2008-041743 A | 2/2008 |

(Continued)

OTHER PUBLICATIONS

Japanese Office Action dated Dec. 17, 2024, in the counterpart Japanese Patent Application No. JP2023-569105.
(Continued)

*Primary Examiner* — Omar F Mojaddedi

(74) *Attorney, Agent, or Firm* — Rabin & Berdo, P.C.

(57) ABSTRACT

A semiconductor module includes: a stacked substrate; a semiconductor element arranged on an upper surface of the first circuit board; a metal wiring board including a first bonding portion bonded to an upper surface of the semiconductor element with a bonding material; and a sealing resin that seals the stacked substrate, the semiconductor element, and the metal wiring board. The first bonding portion includes a plate-shaped portion having an upper surface and a lower surface. The metal wiring board has a first standing portion standing up from one end of the first bonding portion, and a second standing portion standing up from the other end of the first bonding portion. The first standing portion constitutes a part of a wiring path through which a main current flows. The second standing portion constitutes a non-wiring path through which the main current does not flow.

19 Claims, 14 Drawing Sheets

(51) Int. Cl.
| | | |
|---|---|---|
| *H10W 72/60* | (2026.01) | |
| *H10W 90/00* | (2026.01) | |
| *H10W 80/00* | (2026.01) | |

(52) U.S. Cl.
CPC ........ *H10W 90/811* (2026.01); *H10W 80/701* (2026.01); *H10W 90/763* (2026.01); *H10W 90/764* (2026.01); *H10W 90/792* (2026.01)

(58) Field of Classification Search
CPC ..... H10W 72/60; H10W 72/00; H10W 72/30; H10W 76/15; H10W 76/47; H10W 80/701; H10W 90/00; H10W 90/811; H10W 90/763; H10W 90/764; H10W 90/792
See application file for complete search history.

(56) References Cited

U.S. PATENT DOCUMENTS

| | | | | |
|---|---|---|---|---|
| 2008/0150102 A1* | 6/2008 | Yokomae | ........... | H10W 40/255 257/E23.032 |
| 2012/0306086 A1* | 12/2012 | Sugimura | ........... | H10W 40/255 257/762 |
| 2017/0117201 A1* | 4/2017 | Yamada | ................ | H10W 90/00 |

FOREIGN PATENT DOCUMENTS

| | | |
|---|---|---|
| JP | 2014-216450 A | 11/2014 |
| JP | 2014-216458 A | 11/2014 |
| JP | 2014-228330 A | 12/2014 |
| JP | 2016-018866 A | 2/2016 |
| JP | 2016-092878 A | 5/2016 |
| JP | 2017-079228 A | 4/2017 |
| JP | 2019186510 A | 10/2019 |
| WO | 2016/067414 A1 | 5/2016 |

OTHER PUBLICATIONS

International Search Report for PCT/JP2022/039305, mailed on Dec. 6, 2022.
Written Opinion for PCT/JP2022/039305, mailed on Dec. 6, 2022.

* cited by examiner

ST101   SURFACE ROUGHENING STEP

ST102   PUNCHING STEP

ST103   BENDING STEP

ST104   BOSS FORMATION STEP

ST105   CONNECTING BAR CUTTING STEP

IN(P)
UPPER ARM

OUT(M)

IN(N)
LOWER ARM

101

SEMICONDUCTOR MODULE, SEMICONDUCTOR DEVICE, AND VEHICLE

CROSS REFERENCE TO RELATED APPLICATIONS

This is a continuation application of International Application PCT/JP2022/039305 filed on Oct. 21, 2022 which claims priority from a Japanese Patent Application No. 2021-210859 filed on Dec. 24, 2021, the contents of which are incorporated herein by reference.

BACKGROUND

Technical Field

The present invention relates to a semiconductor module, a semiconductor device, and a vehicle.

Related Art

A semiconductor module has a substrate on which a semiconductor element such as an insulated gate bipolar transistor (IGBT), a power metal oxide semiconductor field effect transistor (power MOSFET), and a free wheeling diode (FWD) is provided, and is used in an inverter device and the like.

In this type of semiconductor module, a semiconductor element is arranged on an insulating substrate (which may be referred to as a stacked substrate), and a metal wiring board for wiring (which may be referred to as a terminal connection portion, a lead frame, or an external electrode) is arranged on an upper surface electrode of the semiconductor element in, for example, JP 2017-079228 A, JP 2001-127100 A, and WO 2016/067414 A. The metal wiring board is formed into a predetermined shape by, for example, stamping a metal plate. One end of the metal wiring board is electrically bonded to the upper surface electrode with a bonding material such as solder.

SUMMARY

In this type of semiconductor module, the power semiconductor element generates heat following a switching operation. In the structure in which the metal wiring board is solder-bonded to the surface of the power semiconductor element as described above, distortion may occur in the bonding portion due to a fluctuation of internal stress generated with temperature change. With such a thermal cycle, peeling may occur at an interface of the sealing resin or the bonding material such as solder interposed between the metal wiring board and the semiconductor element. When the peeling progresses, thermal deformation of the metal wiring board increases. Furthermore, electrode distortion of the semiconductor element increases, which may cause a decrease in tolerance of the entire device.

The present invention has been made in view of such a point, and an object of the present invention is to provide a semiconductor module, a semiconductor device, and a vehicle capable of suppressing peeling of a metal wiring board.

A semiconductor module according to an aspect of the present invention includes: a stacked substrate in which a first circuit board is arranged on an upper surface of an insulating plate; a semiconductor element arranged on an upper surface of the first circuit board; a metal wiring board including a first bonding portion bonded to an upper surface of the semiconductor element with a bonding material; and a sealing resin that seals the stacked substrate, the semiconductor element, and the metal wiring board, the first bonding portion including a plate-shaped portion having an upper surface and a lower surface, the metal wiring board having a first standing portion standing up from one end of the first bonding portion, and a second standing portion standing up from the other end of the first bonding portion, the first standing portion constituting a part of a wiring path through which a main current flows, and the second standing portion constituting a non-wiring path through which the main current does not flow.

According to the present invention, it is possible to suppress peeling of a metal wiring board.

DETAILED DESCRIPTION

Figure 1:
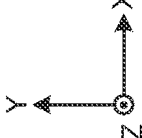
FIG. 1 is a schematic view of a semiconductor device according to a present embodiment as viewed from above.
Figure 2:
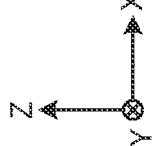
FIG. 2 is a cross-sectional view of the semiconductor device illustrated in FIG. 1 taken along line A-A.
Figure 8:
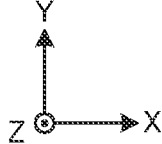
FIG. 8 is a plan view illustrating a specific example of a semiconductor module to which the metal wiring board according to the present embodiment is applied.
Figure 9:
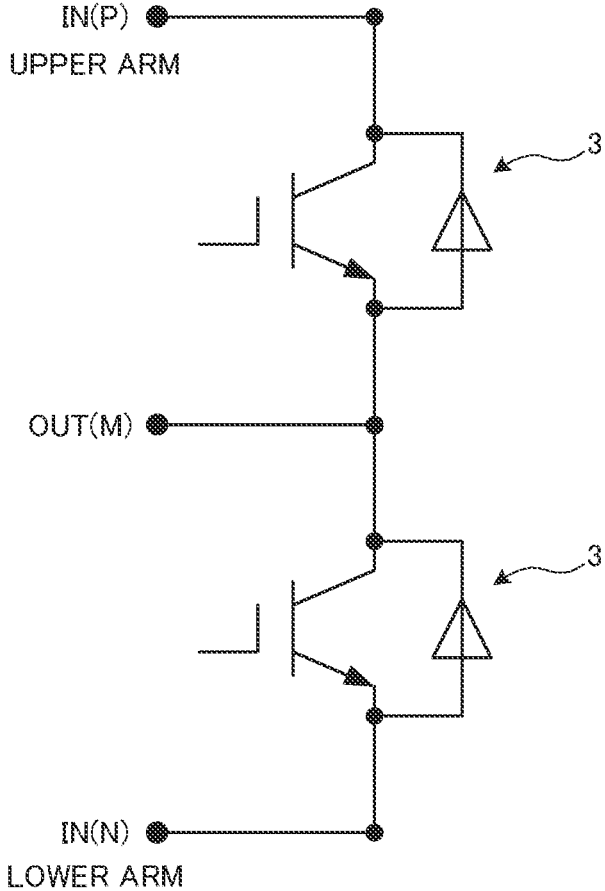
FIG. 9 is an equivalent circuit diagram of the semiconductor device according to the present embodiment.

Hereinafter, a semiconductor module and a semiconductor device to which the present invention can be applied will be described. FIG. 1 is a schematic view of a semiconductor device according to a present embodiment as viewed from above. FIG. 2 is a cross-sectional view of the semiconductor device illustrated in FIG. 1 taken along line A-A. FIG. 8 is a plan view illustrating a specific example of a semiconductor module to which a metal wiring board according to the present embodiment is applied. FIG. 9 is an equivalent circuit diagram of the semiconductor device according to the present embodiment.

In the following drawings, a longitudinal direction of the semiconductor module (a cooler or metal wiring board) is defined as an X direction, a lateral direction of the semiconductor module (the cooler or metal wiring board) is defined as a Y direction, and a height direction (a direction of the thickness of the substrate) is defined as a Z direction. The longitudinal direction of the semiconductor module indicates a direction in which the plurality of circuit boards is arrayed. X, Y, and Z axes illustrated are orthogonal to each other and form a right-handed system. In some cases, the X direction may be referred to as a left-right direction, the Y direction may be referred to as a front-rear direction, and the Z direction may be referred to as an up-down direction. These directions (front-rear, left-right, and up-down directions) are terms used for convenience of description, and a correspondence relationship with the XYZ directions, respectively, may change depending on an attachment posture of the semiconductor module. For example, a heat dissipation surface side (cooler side) of the semiconductor module is referred to as a lower surface side, and the opposite side is referred to as an upper surface side. In the present specification, the term "in a plan view" means a case where an upper surface or a lower surface of the semiconductor module is viewed from the Z direction.

In addition, the aspect ratio and the size relationship between members in the drawings are indicated in schematic views, and thus do not necessarily coincide between the drawings. For convenience of description, it is also assumed that the size relationship between the members is exaggerated.

A semiconductor device 100 according to the present embodiment is applied to, for example, a power conversion device such as an inverter of an industrial or in-vehicle motor. As illustrated in FIGS. 1 and 2, the semiconductor device 100 is configured by arranging a semiconductor module 1 on an upper surface of a cooler 10. Note that the cooler 10 has any configuration with respect to the semiconductor module 1.

The cooler 10 releases heat of the semiconductor module 1 to the outside, and has a rectangular parallelepiped shape as a whole. Although not particularly illustrated, the cooler 10 is configured by providing a plurality of fins on a lower surface side of a base plate and housing these fins in a water jacket. Note that the cooler 10 is not limited thereto and can be appropriately changed.

The semiconductor module 1 is configured by arranging a stacked substrate 2, a semiconductor element 3, a metal wiring board 4, and the like in a case 11.

The stacked substrate 2 is composed of, for example, a direct copper bonding (DCB) substrate, an active metal brazing (AMB) substrate, or a metal base substrate. The stacked substrate 2 is configured by laminating an insulating plate 20, a heat dissipation plate 21, and a plurality of circuit boards (a first circuit board 22 and a second circuit board 23), and is formed in a rectangular shape as a whole in a plan view of the device 100.

Specifically, the insulating plate 20 is formed of a plate-shaped body having an upper surface and a lower surface, and has a rectangular shape elongated in the X direction (first direction) in the plan view. The insulating plate 20 may be formed from, for example, a ceramic material such as aluminum oxide ($Al_2O_3$), aluminum nitride (AlN), silicon nitride ($Si_3N_4$), aluminum oxide ($Al_2O_3$), and zirconium oxide ($ZrO_2$).

In addition, the insulating plate 20 may be formed from, for example, a thermosetting resin such as an epoxy resin or a polyimide resin, or a composite material using glass or a ceramic material as a filler in the thermosetting resin. The insulating plate 20 preferably has flexibility and may be formed from, for example, a material containing a thermosetting resin. Note that the insulating plate 20 may be referred to as an insulating layer or an insulating film.

The heat dissipation plate 21 has a predetermined thickness in the Z direction and has a rectangular shape elongated in the Y direction (second direction) in the plan view. The heat dissipation plate 21 is formed of, for example, a metal plate having good thermal conductivity such as copper or aluminum. The heat dissipation plate 21 is arranged on the lower surface of the insulating plate 20. The lower surface of the heat dissipation plate 21 is a surface to be attached to the cooler 10 to which the semiconductor module 1 is attached, and also functions as a heat dissipation surface (heat dissipation region) for releasing heat of the semiconductor module 1. The heat dissipation plate 21 is bonded to the upper surface of the cooler 10 with a bonding material Si such as solder. The heat dissipation plate 21 may be arranged on the upper surface of the cooler 10 with a thermal conductive material, such as thermal grease or thermal compound, interposed therebetween.

Each of the plurality of circuit boards (the first circuit board 22 and the second circuit board 23) has a predetermined thickness and is arranged on the upper surface of the insulating plate 20. Each circuit board is formed in an electrically independent island shape. For example, the two circuit boards each have a rectangular shape in the plan view, and are arranged side by side in the X direction on the insulating plate 20. Specifically, the first circuit board 22 is positioned on a negative side in the X direction, and the second circuit board 23 is positioned on a positive side in the X direction.

Note that the number of the circuit boards is not limited to two as illustrated in FIG. 1, and can be changed as appropriate. Although details will be described later, three or more circuit boards may be arranged on the insulating plate 20 as illustrated in FIG. 8. In addition, the shape, placement, and the like of the circuit board are not limited thereto and can be changed as appropriate. These circuit boards each are formed of, for example, a metal plate having good thermal conductivity such as copper or aluminum. The circuit boards may be referred to as a circuit layer or a circuit pattern.

The semiconductor element 3 is arranged on an upper surface of the first circuit board 22 with a bonding material S such as solder interposed therebetween. The bonding material S may be a conductive material, and may be, for example, solder or a metal sintered material. The semiconductor element 3 is formed of a semiconductor substrate such as silicon (Si) in a rectangular shape in the plan view.

In addition, the semiconductor element 3 may be composed of a wide bandgap semiconductor element (which may be referred to as a wide gap semiconductor element) formed of a wide bandgap semiconductor substrate such as silicon carbide (SiC), gallium nitride (GaN), and diamond, in addition to the above-described silicon.

As the semiconductor element 3, a switching element such as an insulated gate bipolar transistor (IGBT) and a power metal oxide semiconductor field effect transistor (power MOSFET), and a diode such as a free wheeling diode (FWD) are used.

In the present embodiment, the semiconductor element 3 is composed of a reverse conducting (RC)-IGBT element in which the functions of an insulated gate bipolar transistor (IGBT) element and a free wheeling diode (FWD) element are integrated (for example see FIG. 9).

Note that the semiconductor element 3 is not limited thereto, and may be configured by combining the above-described switching element, diode, and the like. For example, the IGBT element and the FWD element may be configured separately. A reverse blocking (RB)-IGBT or the like having a sufficient withstand voltage against a reverse bias may be used as the semiconductor element 3. In addition, the shape, number, placement, and the like of the semiconductor element 3 can be changed as appropriate. For example, as illustrated in FIGS. 8 and 9, four semiconductor elements 3 may be provided, and each pair of semiconductor elements 3 may be connected to each other to form an upper arm and a lower arm.

The semiconductor element 3 configured as described above has an upper surface and a lower surface in the XY plane, and an electrode (not illustrated) is formed on each surface. For example, a main electrode and a gate electrode are formed on the upper surface of the semiconductor element 3, and a main electrode is also formed on the lower surface of the semiconductor element 3.

When the semiconductor element 3 is a MOSFET element, the main electrode on the upper surface side may be referred to as a source electrode, and the main electrode on the lower surface side may be referred to as a drain electrode. When the semiconductor element 3 is an IGBT element, the main electrode on the upper surface side may be referred to as an emitter electrode, and the main electrode on the lower surface side may be referred to as a collector electrode. In addition, the type of the element is not limited, and the gate electrode may be directly referred to as a gate electrode. In addition, an auxiliary electrode may be provided on the upper surface of the semiconductor element 3 separately from the main electrode. For example, the auxiliary electrode may be an auxiliary source electrode or an auxiliary emitter electrode electrically connected to the main electrode on the upper surface side and serving as a reference potential with respect to a gate potential. In addition, the auxiliary electrode may be a temperature sensing electrode which is electrically connected to a temperature sensing portion to be described later and measures the temperature of the semiconductor element. Such electrodes (the main electrode, gate electrode, and auxiliary electrode) formed on the upper surface of the semiconductor element 3 may be generally referred to as upper surface electrodes, and the electrode formed on the lower surface of the semiconductor element 3 may be referred to as a lower surface electrode. Among the upper surface electrodes, the gate electrode and the auxiliary electrode may be referred to as control electrodes.

In the present embodiment, the main electrode is an electrode through which a main current flows, and the gate electrode is an electrode for controlling ON/OFF of the main current. The upper surface electrode of semiconductor element 3 will be described later in detail.

In addition, the semiconductor element 3 in the present embodiment may be a so-called vertical switching element in which functional elements such as transistors are formed on the semiconductor substrate in a thickness direction, or a horizontal switching element in which these functional elements are formed in a plane direction.

The upper surface (main electrode) of the semiconductor element 3 and the upper surface of the second circuit board 23 are electrically connected by the metal wiring board 4. The metal wiring board 4 constitutes a main current wiring member, and functions as a part of a path (main current path) of a main current flowing in the semiconductor module 1.

The metal wiring board 4 is composed of a plate-shaped body having an upper surface and a lower surface. The thickness of the metal wiring board 4 may be 0.1 mm or more and 2.5 mm or less. The metal wiring board 4 is formed of, for example, a metal such as copper, a copper alloy, an aluminum alloy, or an iron alloy. The metal wiring board 4 is formed into a predetermined shape by, for example, stamping. Note that the shape of the metal wiring board 4 described below is merely an example, and can be changed as appropriate. In addition, the metal wiring board 4 may be referred to as a lead frame.

The metal wiring board 4 according to the present embodiment is a long-length body extending in the X direction in the plan view, and has a crank shape having bent portions formed by being bent a plurality of times in side view. Specifically, the metal wiring board 4 includes a first bonding portion 40, a second bonding portion 41, and a connecting portion 42. The first bonding portion 40 is bonded to the upper surface of the semiconductor element 3 with a bonding material S. The second bonding portion 41 is bonded to the upper surface of the second circuit board 23 with a bonding material S. The connecting portion 42 connects the first bonding portion 40 and the second bonding portion 41.

The first bonding portion 40 is formed in a rectangular shape smaller than the outer shape (or the upper surface electrode) of the semiconductor element 3 in the plan view. The first bonding portion 40 includes a plate-shaped portion having an upper surface and a lower surface in the XY plane and having a thickness in the Z direction. The first bonding portion 40 is arranged to face the upper surface electrode of the semiconductor element 3 in the Z direction, and is bonded thereto with a bonding material S.

Although details will be described later, a plurality of bosses 40a protruding toward the semiconductor element 3 are formed on a lower surface of the first bonding portion 40. In addition, on an upper surface of the first bonding portion 40, recesses (third recesses) 40b are formed at positions corresponding to immediately above the bosses 40a.

A first standing portion 43 which is bent at a substantially right angle and stands up is formed at one end (an end portion on a positive side in the X direction) of the first bonding portion 40. The first standing portion 43 includes a plate-shaped portion having a flat surface in the YZ plane and having a thickness in the X direction. The connecting portion 42 which is bent at a substantially right angle and extends in the X direction is formed at an upper end of the first standing portion 43. That is, one end (a left end) of the connecting portion 42 is connected to the upper end of the first standing portion 43.

In addition, a second standing portion 44 which is bent at a substantially right angle with respect to the first bonding portion 40 and stands up is formed at the other end (an end portion on a negative side in the X direction) of the first bonding portion 40. The second standing portion 44 includes a plate-shaped portion having a flat surface in the YZ plane and having a thickness in the X direction. Although details will be described later, an upper end of the second standing portion 44 is positioned higher than the first standing portion 43. In addition, the first standing portion 43 and the second standing portion 44 are formed on opposite sides of the rectangular first bonding portion 40. The first standing portion 43 and the second standing portion 44 are arranged to face each other in the X direction.

The second bonding portion 41 is formed in a rectangular shape smaller than the outer shape of the second circuit board 23 in the plan view. The second bonding portion 41 includes a plate-shaped portion having an upper surface and a lower surface in the XY plane and having a thickness in the Z direction. The second bonding portion 41 is arranged to face the second circuit board 23 in the Z direction, and is bonded thereto with a bonding material S.

Although details will be described later, a plurality of bosses 41a protruding toward the second circuit board 23 are formed on a lower surface of the second bonding portion 41. In addition, on an upper surface of the second bonding portion 41, recesses 41b are formed at positions corresponding to immediately above the bosses 41a.

In addition, a third standing portion 45 which is bent at a substantially right angle with respect to the second bonding portion 41 and stands up is formed at one end (an end portion on a negative side in the X direction) of the second bonding portion 41. The third standing portion 45 includes a plate-shaped portion having a flat surface in the YZ plane and having a thickness in the X direction. The connecting portion 42 which is bent at a substantially right angle and extends to the negative side in the X direction is formed at an upper end of the third standing portion 45. That is, the other end (a right end) of the connecting portion 42 is connected to the upper end of the third standing portion 45.

The connecting portion 42 includes a plate-shaped portion having an upper surface and a lower surface in the XY plane and having a thickness in the Z direction. As described above, one end (the end portion on the negative side in the X direction) of the connecting portion 42 is connected to the first standing portion 43, and the other end (the end portion on the positive side in the X direction) of the connecting portion 42 is connected to the second standing portion 44. That is, the connecting portion 42 connects the upper end of the first standing portion 43 and the upper end of the third standing portion 45.

In addition, the length of the first standing portion 43 in the Z direction is shorter than that of the third standing portion 45 by the thickness of the semiconductor element 3. That is, the first bonding portion 40 and the second bonding portion 41 are provided at positions with different heights. More specifically, the first bonding portion 40 is provided at a position higher than the second bonding portion 41.

The width of the metal wiring board 4, configured as described above, in the Y direction is uniform from the first bonding portion 40 to the second bonding portion 41. The thickness of the metal wiring board 4 is uniform from the first bonding portion 40 to the second bonding portion 41. In addition, the first bonding portion 40, the second bonding portion 41, and the connecting portion 42 are arranged in a line along the X direction in the plan view. Note that the width of the metal wiring board 4 in the Y direction is not necessarily uniform from the first bonding portion 40 to the second bonding portion 41, and each portion may have a different width as illustrated in FIG. 8. The thickness of the metal wiring board 4 is not necessarily uniform from the first bonding portion 40 to the second bonding portion 41, and each bent portion may be partially thin. In addition, the first bonding portion 40, the second bonding portion 41, and the connecting portion 42 are not necessarily arranged in a line, and may be arranged to be obliquely shifted from each other as illustrated in FIG. 8.

Note that the shape, number, placement, and the like of the metal wiring board 4 described above are merely examples, and are not limited thereto and can be changed as appropriate. Although details will be described later, a plurality of (for example, four) metal wiring boards 4 may be arranged on one semiconductor module as illustrated in FIG. 8. In the present embodiment, the above-described semiconductor element 3 and metal wiring board 4, and a main terminal and the like to be described later may form, for example, an inverter circuit illustrated in FIG. 9.

The periphery of the stacked substrate 2, the semiconductor element 3, and the metal wiring board 4 is surrounded by the case 11. The case 11 has a quadrangular annular tubular shape or a frame shape in the plan view, and is formed of, for example, a synthetic resin. The case 11 may be formed of, for example, a thermosetting resin material such as an epoxy resin or silicone rubber. The lower end of the case 11 is adhered to the upper surface of the cooler 10 with an adhesive (not illustrated), and the upper end extends to a position sufficiently higher than the upper surface of the metal wiring board 4. Thus, the case 11 surrounds the periphery of the stacked substrate 2, the semiconductor element 3, and the metal wiring board 4, and defines a space for housing the stacked substrate 2, the semiconductor element 3, and the metal wiring board 4.

The internal space defined by the case 11 is filled with a sealing resin 5. The case 11 may be filled with the sealing resin 5 until its upper surface reaches the upper end of the case 11. Thus, the stacked substrate 2, the semiconductor element 3, and the metal wiring board 4 are sealed. The entire metal wiring board 4 is covered with the sealing resin 5.

The sealing resin 5 may be composed of, for example, a thermosetting resin. The sealing resin 5 preferably contains at least one of epoxy, silicone, urethane, polyimide, polyamide, and polyamide-imide. For example, an epoxy resin mixed with a filler is suitable for the sealing resin 5 from the viewpoint of insulation, heat resistance, and heat dissipation properties.

As in the specific example illustrated in FIG. 8, the case 11 may be provided with a plurality of main terminals 60 for main current and a plurality of control terminals 64 for control. The main terminal 60 is formed of a plate-shaped long-length body. The main terminal 60 is embedded in a side wall of the case 11. One end thereof extends inward from the side wall of the case 11, and the other end extends outward from the side wall of the case 11. One end of the main terminal 60 is electrically connected to a predetermined main electrode of the semiconductor element 3. In FIG. 8, two main terminals 60 constituting an N terminal and a P terminal, respectively, are arranged side by side in the X direction on the side wall of the case 11 positioned on the negative side in the Y direction. In addition, a main terminal 60 constituting an M terminal is arranged on the side wall of the case 11 positioned on the positive side in the Y direction.

As described above, in the present embodiment, the semiconductor element 3, the metal wiring board 4, the main terminals 60, and the like form, for example, the inverter circuit illustrated in FIG. 9. These main terminals 60 (the N terminal, P terminal, M terminal) correspond to IN (N) (which may be referred to as a low potential-side input terminal or a negative electrode terminal), IN (P) (which may be referred to as a high potential-side input terminal or a positive electrode terminal), and OUT (M) (which may be referred to as an output terminal or an intermediate terminal) in FIG. 9, respectively.

In addition, the control terminal 61 is formed of a plate-shaped long-length body. The control terminal 61 is embedded in the side wall of the case 11 positioned on the positive side in the Y direction. One end of the control terminal 61 extends inward from the side wall of the case 11, and the other end of the control terminal 61 extends outward from the side wall of the case 11. One end of the control terminal 61 is electrically connected to a predetermined control electrode of the semiconductor element 3 via a wiring member such as a bonding wire.

The main terminal 60 and the control terminal 61 are formed of a metal such as copper, a copper alloy, an aluminum alloy, or an iron alloy, and have predetermined electrical conductivity and predetermined mechanical strength. The shapes, numbers, placement, and the like of the main terminal 60 and the control terminal 61 are not limited thereto, and can be changed as appropriate.

By the way, when the semiconductor module is subjected to a power cycle test and operated until failure occurs, many of the failures are due to electrode failure of the semiconductor element. As factors that can cause an early failure of the semiconductor module, for example, the following events are considered.

Thermal stress causes peeling from the interface between the bonding material, which is between the semiconductor element and the metal wiring board, and the sealing resin. The peeling progresses along the interface between the metal wiring board and the sealing resin. When thermal deformation of the metal wiring board increases due to the progress of the peeling, electrode distortion increases, leading to a decrease in tolerance. Therefore, in order to improve the tolerance of the semiconductor module, it is necessary to suppress the peeling at the interfaces between the metal wiring board, the bonding material, and the sealing resin.

Therefore, the present inventors have conceived the present invention in order to suppress the peeling of the metal wiring board. Hereinafter, a structure of the semiconductor module according to the present embodiment, particularly a detailed structure of the metal wiring board will be described.

Figure 3:
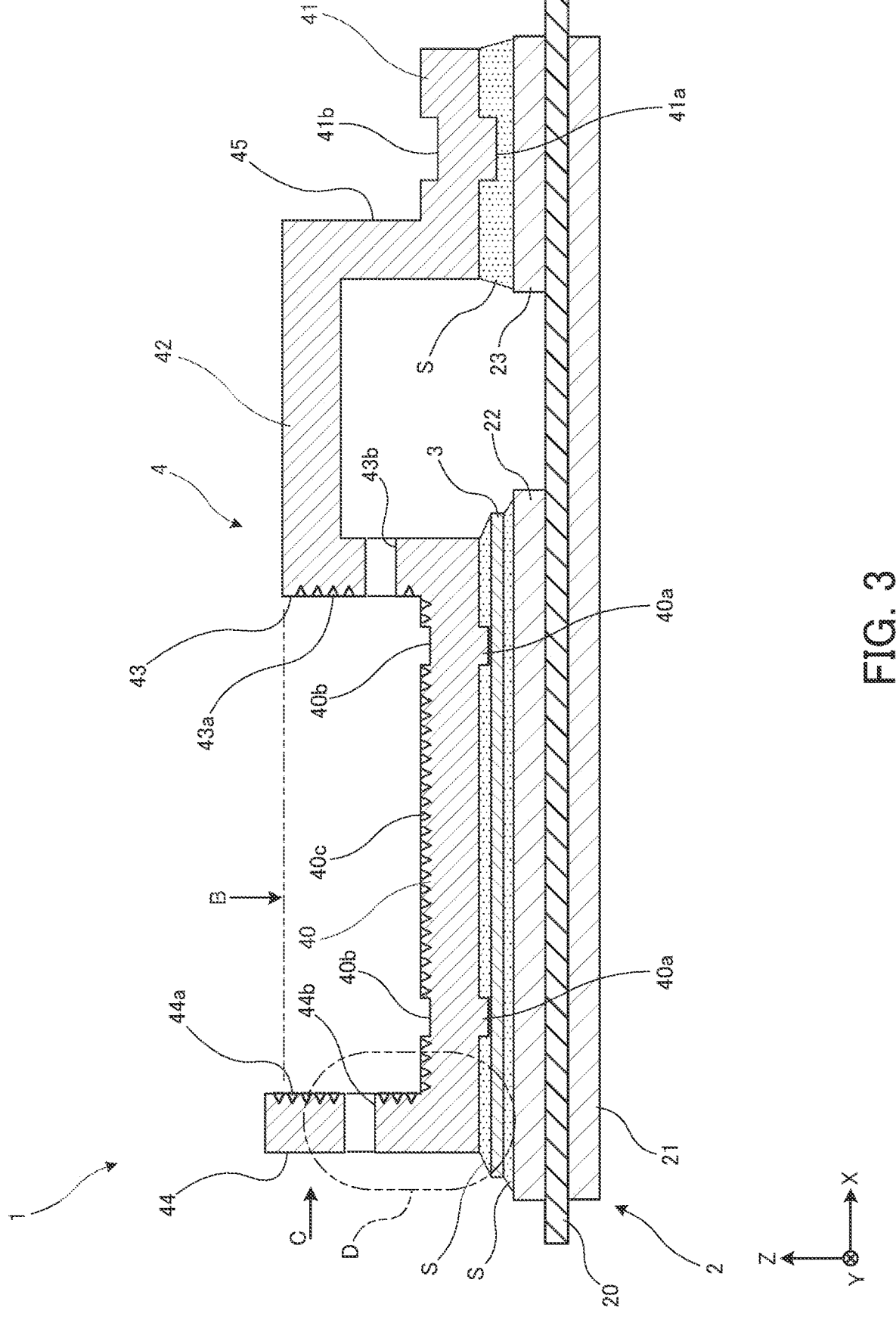
FIG. 3 is an enlarged view of a metal wiring board according to the present embodiment.
Figure 4A:
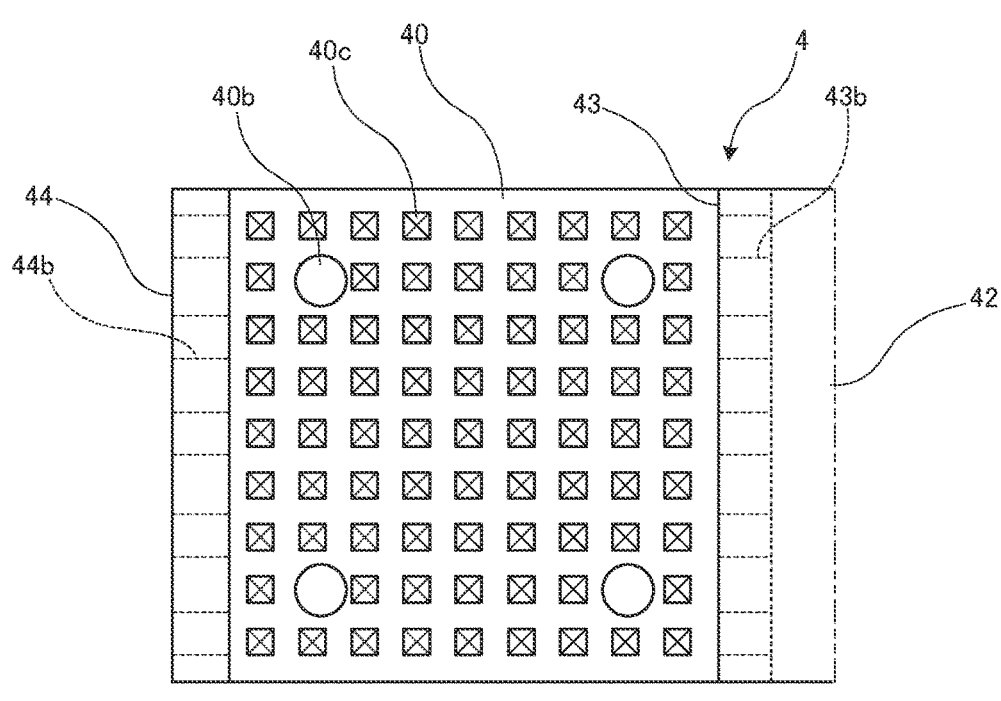
FIGS. 4A and 4B each are a plan view of the metal wiring board illustrated in FIG. 3 as viewed in a direction of arrow B.
Figure 4B:
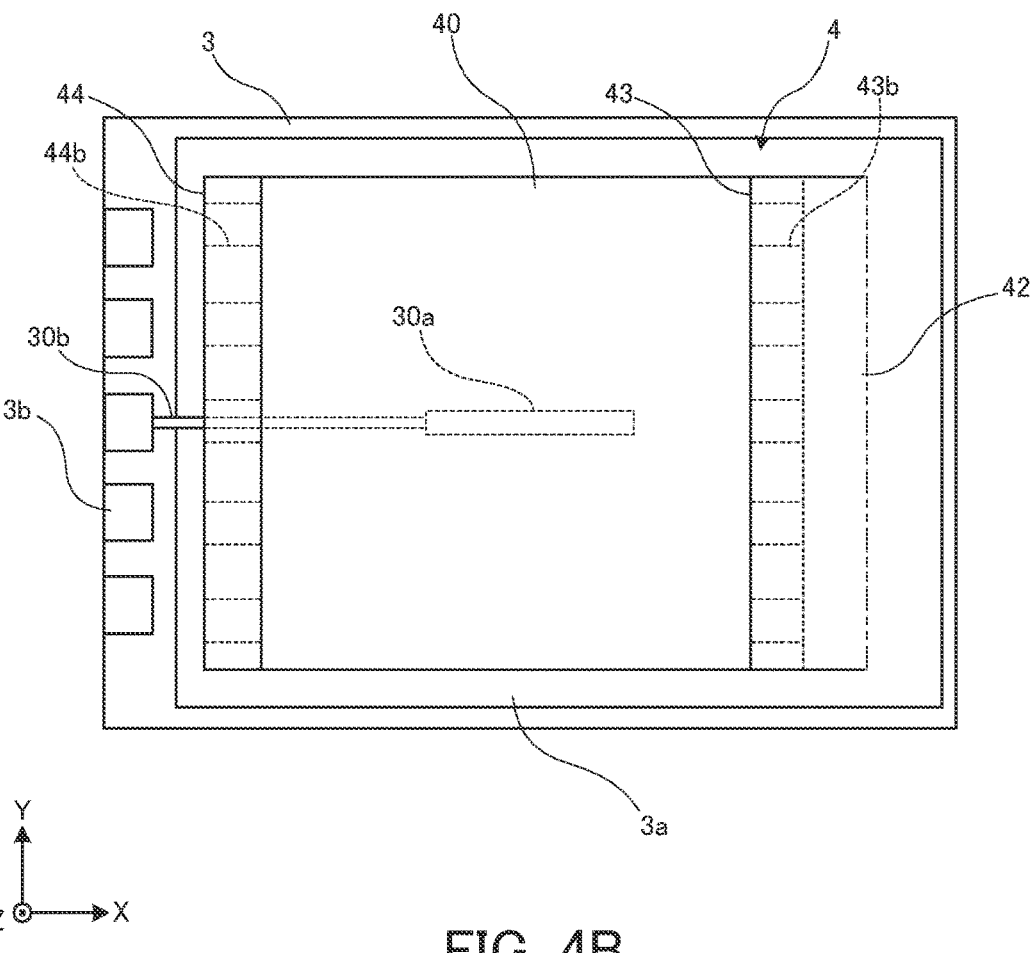
Figure 5:
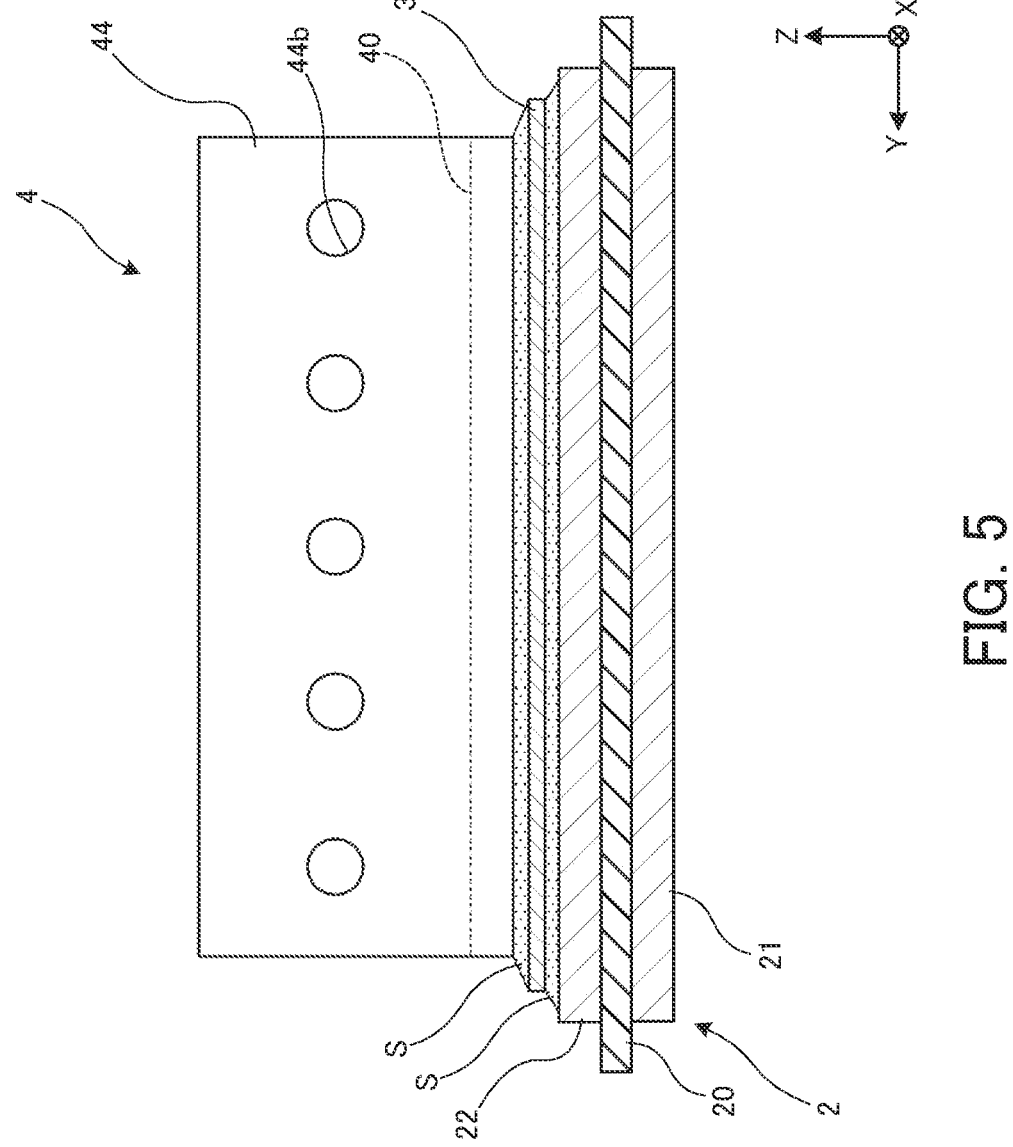
FIG. 5 is a side view of the metal wiring board illustrated in FIG. 3 as viewed in a direction of arrow C.
Figure 6:
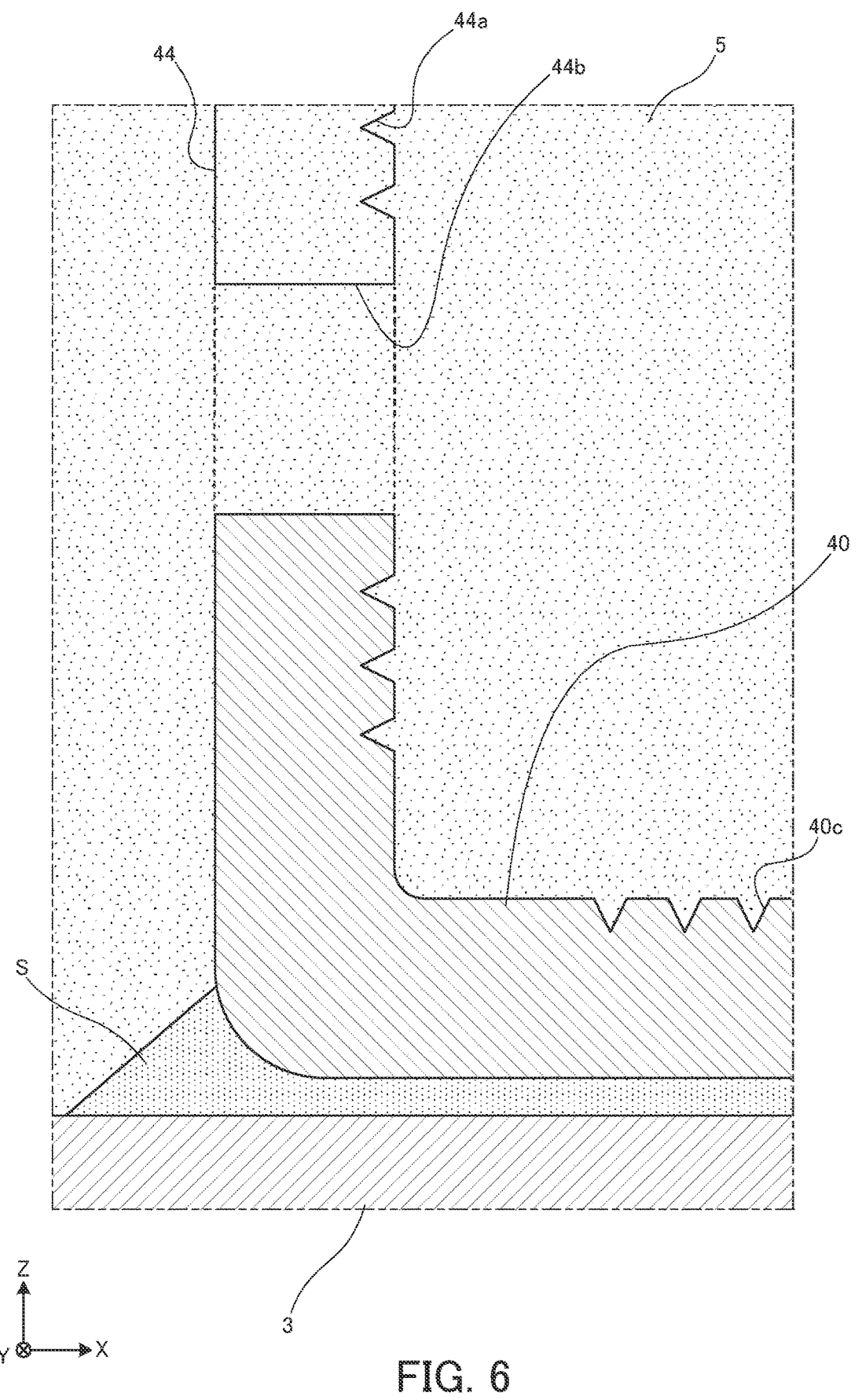
FIG. 6 is an enlarged view around a portion D in FIG. 3.

FIG. 3 is an enlarged view of the metal wiring board according to the present embodiment. FIGS. 4A and 4B each are a plan view of the metal wiring board illustrated in FIG. 3 as viewed in a direction of arrow B. In particular, FIG. 4A is a detailed view of the surface of the metal wiring board, and FIG. 4B is a view illustrating the configuration of the surface of the semiconductor element in a transparent manner while omitting details of the surface. FIG. 5 is a side view of the metal wiring board illustrated in FIG. 3 as viewed in a direction of arrow C. FIG. 6 is an enlarged view around a portion D in FIG. 3.

As illustrated in FIGS. 3 to 6, the recesses 40b are formed by recessing the first bonding portion 40 of the metal wiring board 4 from the upper surface side, and the bosses 40a are formed to protrude from the lower surface side. On the upper surface of the first bonding portion 40, a plurality of recesses (second recesses) 40c smaller than the recess 40b are formed. The above-described bosses 40a and recesses 40b and 40c are formed by stamping.

The bosses 40a are arranged at positions close to four corners of the rectangular first bonding portion 40 in the plan view. By forming the plurality of bosses 40a as described above, the first bonding portion 40 is not inclined with respect to the upper surface of semiconductor element 3 in the bonding step for the metal wiring board 4. Thus, the posture of the metal wiring board 4 (the first bonding portion 40) can be stabilized.

In addition, by providing the bosses 40a on the lower surface of the metal wiring board 4, a gap can be secured between the first bonding portion 40 and the semiconductor element 3 by at least the height of the boss 40a. By filling the gap with the bonding material S, the thickness of the bonding material S can be secured.

The upper surface of the first bonding portion 40 is roughened by forming the plurality of recesses 40c. As a result, the surface area of the upper surface of the first bonding portion 40 increases, and the adhesion (anchor effect) between the upper surface of the first bonding portion 40 and the sealing resin can be improved. Thus, the progress of the peeling of the upper surface of the metal wiring board

4 due to thermal stress can be suppressed at a position above the semiconductor element 3.

In addition, the bosses 41a protruding toward the second circuit board 23 are also formed on the back surface side of the second bonding portion 41. Accordingly, a gap can be secured between the second bonding portion 41 and the second circuit board 23 by at least the height of the boss 41a. By filling the gap with the bonding material S, the thickness of the bonding material S can be secured.

As illustrated in FIG. 4A, in the present embodiment, a total of four bosses 40a are provided, two bosses in the X direction and two bosses in the Y direction. The four bosses 40a are arranged at positions corresponding to the four corners of the first bonding portion 40 along the outer peripheral edge of the first bonding portion 40. The boss 40a has, for example, a cylindrical shape. In addition, on the upper surface of the first bonding portion 40, the recesses 40b are formed at positions corresponding to immediately above the bosses 40a. The recess 40b may have a complementary shape to the boss 40a, and may have, for example, a cylindrical shape having the same diameter as that of the boss 40a.

In addition, two bosses 41a are arranged side by side in the Y direction on the lower surface of the second bonding portion 41. The shape of the boss 41a may be the same as or different from the boss 40a described above. In addition, on the upper surface of the second bonding portion 41, the recesses 41b are formed at positions corresponding to immediately above the bosses 41a. The recess 41b may have a complementary shape to the boss 41a, and may have, for example, a cylindrical shape having the same diameter as that of the boss 41a. In addition, the recess 41b may have the same shape and size as those of the recess 40b.

The shapes, arrangements, and numbers of the bosses 40a and 41a, the recesses 40b and 41b, and the recesses 40c are not limited thereto, and can be changed as appropriate. For example, the shapes of the bosses 40a and 41a are not limited to a cylindrical shape, and may be a prismatic shape, a truncated cone shape tapered downward, or a hemispherical shape.

In addition, the recess 40c is smaller than the recess 40b in the plan view. For example, the recess 40c may have a polygonal shape (Including triangles, quadrangles, pentagons, etc.) in the plan view. In addition, the recess 40c may have a square shape in the plan view. A length D2 of one side of the square-shaped recess 40c may be, for example, 50 μm or more and 600 μm or less, and is preferably 80 μm or more and 300 μm or less.

In addition, the recess 40c may have a quadrangular pyramid shape. A depth of the recess 40c may be 25% or more and 150% or less of the length D2 of one side of the recess 40c, and is preferably 50% or more and 110% or less. This shape allows the stamping die to have a simple shape. For example, the depth of the recess 40c may be smaller than the depth of the recess 40b. The depth of the recess 40c may be 30% or more and 90% or less of the depth of the recess 40b, and is preferably 50% or more and 75% or less.

The plurality of recesses 40c formed as described above may be arranged side by side in a lattice shape with a predetermined pitch P at intervals in the X direction and the Y direction, for example. The predetermined pitch may be, for example, 50 μm or more and 900 μm or less, and is preferably 100 μm or more and 600 μm or less. Note that the plurality of recesses 40c may be formed on the upper surface of the second bonding portion 41, or may be formed only on the first bonding portion 40.

In addition, the portion of the lower surface of the first bonding portion 40 excluding the bosses 40a is preferably a flat surface. That is, it is preferable that the recesses 40c be not formed on the lower surface of the first bonding portion 40. For example, the surface roughness of the lower surface of the first bonding portion 40 is preferably smaller than the surface roughness of the upper surface of the first bonding portion 40. When the lower surface of the first bonding portion 40 is flat, voids and sink marks are unlikely to occur in the bonding material S.

More specifically, the surface roughnesses of the upper surface and the lower surface of the first bonding portion 40 in the present embodiment were compared using a developed interfacial area ratio (Sdr). Here, the developed interfacial area ratio is a value measured in accordance with ISO 25178. In addition, an example of the measurement environment for measuring each parameter is as follows. In addition, the measurement region is preferably in a range where the recess 40c is within at least one pitch. However, the measurement environment is not limited thereto, and it is also possible to use a value measured under an equivalent measurement environment.

[Example of Measurement Environment]

Measurement equipment: VK-X1100 manufactured by KEYENCE CORPORATION

Controller portion: VK-X1000 manufactured by KEYENCE CORPORATION

Objective lens: Apo 20×

Cutoff: Gaussian

S filter: none

L filter: none

F-operation: none

For example, on the lower surface of the first bonding portion 40, the developed interfacial area ratio is 0<Sdr<0.2, and more preferably 0.02<Sdr<0.15. If the lower surface of the first bonding portion 40 is too rough, the wettability of solder worsens and thus voids and sink marks are likely to occur. Meanwhile, on the upper surface of the first bonding portion 40, the developed interfacial area ratio is 0.10 Sdr<1.0, and more preferably 0.2 Sdr<1.0. If the developed interfacial area ratio is too small on the upper surface of the first bonding portion 40, peeling may not be sufficiently suppressed. In addition, if the developed interfacial area ratio is too large, warpage, undulation, and the like may occur during processing, leading to deformation.

In addition, the area of the recess 40c in the plan view may be 0.5% or more and 75% or less of the area of the boss 40a or the recess 40b, and is preferably 1.0% or more and 25% or less. Within this range, the surface area of the upper surface of the first bonding portion 40 can be effectively increased.

In addition, in the metal wiring board 4 according to the present embodiment, the second standing portion 44 standing up is provided at the distal end of first bonding portion 40. Due to the second standing portion 44, it is possible to equalize the elongation on the proximal end side (the end portion on the positive side in the X direction) and on the distal end side (the end portion on the negative side in the X direction) of the first bonding portion 40. This is because the surface area of the first bonding portion 40 in the vicinity of the distal end is increased due to the second standing portion 44, so that the contact area with the sealing resin 5 can be sufficiently secured as in the proximal end portion. As a result, the deformation quantity of the first bonding portion 40 as a whole due to thermal stress can be suppressed, and the peeling suppression effect at the interface can be improved.

In addition, the main current flows between the semiconductor element 3 and the second circuit board 23 through a part of the metal wiring board 4. The first bonding portion 40 and the first standing portion 43 are positioned on the wiring path between the semiconductor element 3 and the second circuit board 23. Therefore, the first standing portion 43 constitutes a part of the wiring path through which the main current flows. The second standing portion 44 is not positioned on the wiring path between semiconductor element 3 and another semiconductor element, terminal, or circuit board (for example, the second circuit board 23). Therefore, the main current rarely flows through the second standing portion 44. Here, the position where the main current does not flow is referred to as a non-wiring path. The second standing portion 44 constitutes the non-wiring path.

In addition, the first standing portion 43 and the second standing portion 44 are arranged to face each other, and the upper end of the second standing portion 44 is at a position higher than the first standing portion 43. Accordingly, it is possible to further secure the surface area on the distal end side of the first bonding portion 40 and to more effectively suppress the interfacial shift.

In addition, a plurality of recesses (first recesses) 44a are formed on an inner side surface of the second standing portion. In addition, a plurality of recesses (second recesses) 43a may also be formed on an inner side surface of the first standing portion 43. The recesses 44a and 43a may be configured to be the same as the above-described recesses 40c in terms of shape, number, and density. As described above, by roughening the inner side surfaces of the second standing portion 44 and the first standing portion 43, the surface areas of these inner side surfaces increase, and the adhesion (anchor effect) with the sealing resin can be improved. Thus, the progress of the peeling of the metal wiring board 4 due to thermal stress can be effectively suppressed at a position above the semiconductor element 3.

In addition, as illustrated in FIGS. 3 to 6, the second standing portion 44 has a penetrating portion 44b penetrating in the thickness direction (X direction). As illustrated in FIG. 5, the penetrating portion 44b is formed of, for example, a circular hole. For example, a plurality of (five in FIG. 5) the penetrating portions 44b are formed side by side in the Y direction. In addition, as illustrated in FIG. 6, the penetrating portion 44b is filled with the sealing resin 5. Accordingly, the adhesion between the second standing portion 44 and the sealing resin 5 is improved, and in particular, deformation of the second standing portion 44 in the Z direction can be effectively suppressed. The shape and number of the penetrating portion 44b can be changed as appropriate.

In addition, as shown in FIG. 4B, a main electrode 3a and a plurality of control electrodes 3b are arranged on the upper surface of semiconductor element 3 according to the present embodiment. The main electrode 3a is formed in a rectangular shape in the plan view, having an area including the majority of the upper surface of the semiconductor element 3. Specifically, the main electrode 3a has an area larger than that of the first bonding portion 40 in the plan view. The plurality of (for example, five) control electrodes 3b are arranged side by side along one side of the semiconductor element 3 on the negative side in the X direction.

Furthermore, a temperature sensing portion 30a for detecting a temperature of the semiconductor element 3 may be provided on the upper surface of the semiconductor element 3. The temperature sensing portion 30a has a long shape in the plan view, that is long in a predetermined direction (for example, the X direction) at the center of the upper surface of the semiconductor element 3 (main electrode 3a). In addition, sense wiring 30b for output is electrically connected to the temperature sensing portion 30a. The sense wiring 30b may be referred to as a runner.

The sense wiring 30b linearly extends from the center of the upper surface of the semiconductor element 3 toward the outer edge (one side on the negative side in the X direction) of the semiconductor element 3. As described above, one end of the sense wiring 30b is electrically connected to the temperature sensing portion 30a. In addition, the other end of the sense wiring 30b is electrically connected to a predetermined control electrode 3b. More specifically, the other end of the sense wiring 30b is connected to the control electrode 3b positioned at the center among the five control electrodes 3b. In this case, the predetermined control electrode 3b connected to the sense wiring 30b may be referred to as a temperature sensing electrode.

In addition, the sense wiring 30b and the second standing portion 44 are provided to overlap (intersect) each other in the plan view. Since the bonding position between the sense wiring 30b and the first bonding portion 40 is a region where peeling relatively easily occurs, the bonding strength can be increased by positioning the second standing portion 44 immediately above the sense wiring 30b. Therefore, it is possible to prevent the peeling at the position.

Figure 7:
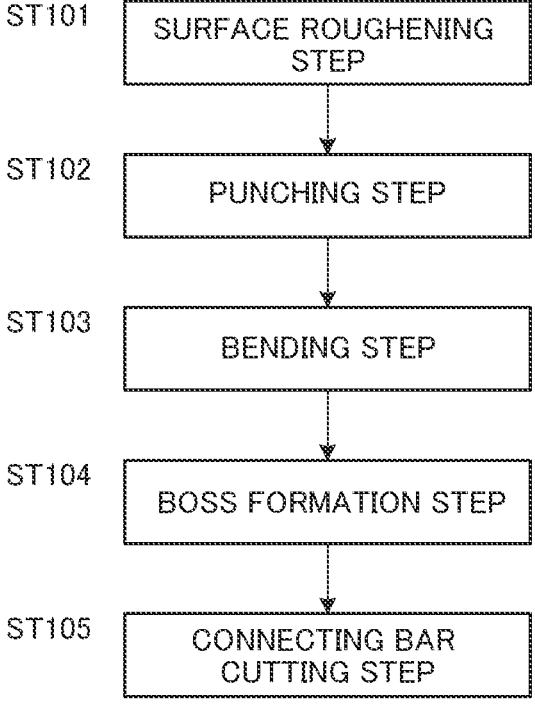
FIG. 7 is a flowchart illustrating an example of a method for manufacturing a semiconductor module according to the present embodiment.

Next, a method for manufacturing the metal wiring board 4 configured as described above will be described. FIG. 7 is a flowchart illustrating an example of a method for manufacturing the semiconductor module (the metal wiring board) according to the present embodiment.

As illustrated in FIG. 7, the method for manufacturing the semiconductor module 1 according to the present embodiment preferably includes the following steps ST101 to ST105 in the process of manufacturing the metal wiring board 4.

In step ST101, a surface roughening step is performed first. In this step, the plurality of recesses 40c is formed on the upper surface of the first bonding portion 40, the plurality of recesses 43a are formed on the inner side surface of the first standing portion 43, and the plurality of recesses 44a are formed on the inner side surface of the second standing portion 44. Here, a metal plate is prepared as a material of the metal wiring board 4. Then, the metal plate is arranged so that a lower surface of the metal plate corresponding to the lower surface of the metal wiring board 4 is in contact with a lower die having a flat surface. In this stage, the upper surface of the first bonding portion 40, the inner side surface of the first standing portion 43, and the inner side surface of the second standing portion 44 are on the same plane. Then, an upper die having a predetermined protrusion shape is pressed against an upper surface of the metal plate corresponding to the upper surface of the metal wiring board 4. Thus, the plurality of recesses 40c, 43a, and 44a are formed in predetermined regions on the upper surface of the metal plate. The lower surface of the metal plate is formed flat. Furthermore, a region corresponding to the recess 40b may be excluded from the surface roughening.

In step ST102, a punching step is performed. In this step, the metal plate is punched into a predetermined shape. The term "predetermined shape" may refer to an outer shape in which a plurality of metal wiring boards 4 are partially connected by connecting bars (not illustrated). In this case, the penetrating portions 43b and 44b may be punched according to a predetermined die shape.

In step ST103, a bending step is performed. In this step, the metal wiring board 4 is bent at a predetermined position and formed into a crank shape. Accordingly, the first bonding portion 40, the second bonding portion 41, the connecting portion 42, the first standing portion 43, the second standing portion 44, and the third standing portion 45 are formed in the metal wiring board 4.

In step ST104, a boss formation step is performed. In this step, at predetermined positions (for example, the first bonding portion 40) on the metal wiring board 4, the recesses 40b are formed on the upper surface and the bosses 40a are formed on the lower surface. For example, the metal wiring board 4 is arranged so that the lower surface of the metal wiring board 4 is in contact with the lower die having a recess corresponding to the boss 40a. Then, the upper die having a protrusion shape corresponding to the recess 40b is pressed against the upper surface of the metal wiring board 4. Thus, the plurality of recesses 40b are formed on the upper surface of the metal wiring board 4, and the plurality of bosses 40a are formed on the lower surface of the metal wiring board 4. The same applies to the bosses 41a and the recesses 41b.

In step ST105, a connecting bar cutting step is performed. In this step, the connecting bars of the plurality of metal wiring boards 4, connected by the connecting bars, are cut to obtain the individual metal wiring boards 4. This step may also be performed by stamping using two upper and lower dies.

In steps ST101 to 105 described above are all realized by stamping. Thus, it is possible to realize boss formation and surface roughening with an inexpensive configuration as compared with a case where laser processing or a chemical solution is used. Each step is merely an example, and the order of the steps can be changed as appropriate within a range not causing contradiction. In addition, other steps such as a plating treatment and a rust prevention treatment may be included.

As described above, according to the present embodiment, it is possible to improve the bonding strength between the semiconductor element and the metal wiring board.

Figure 10:
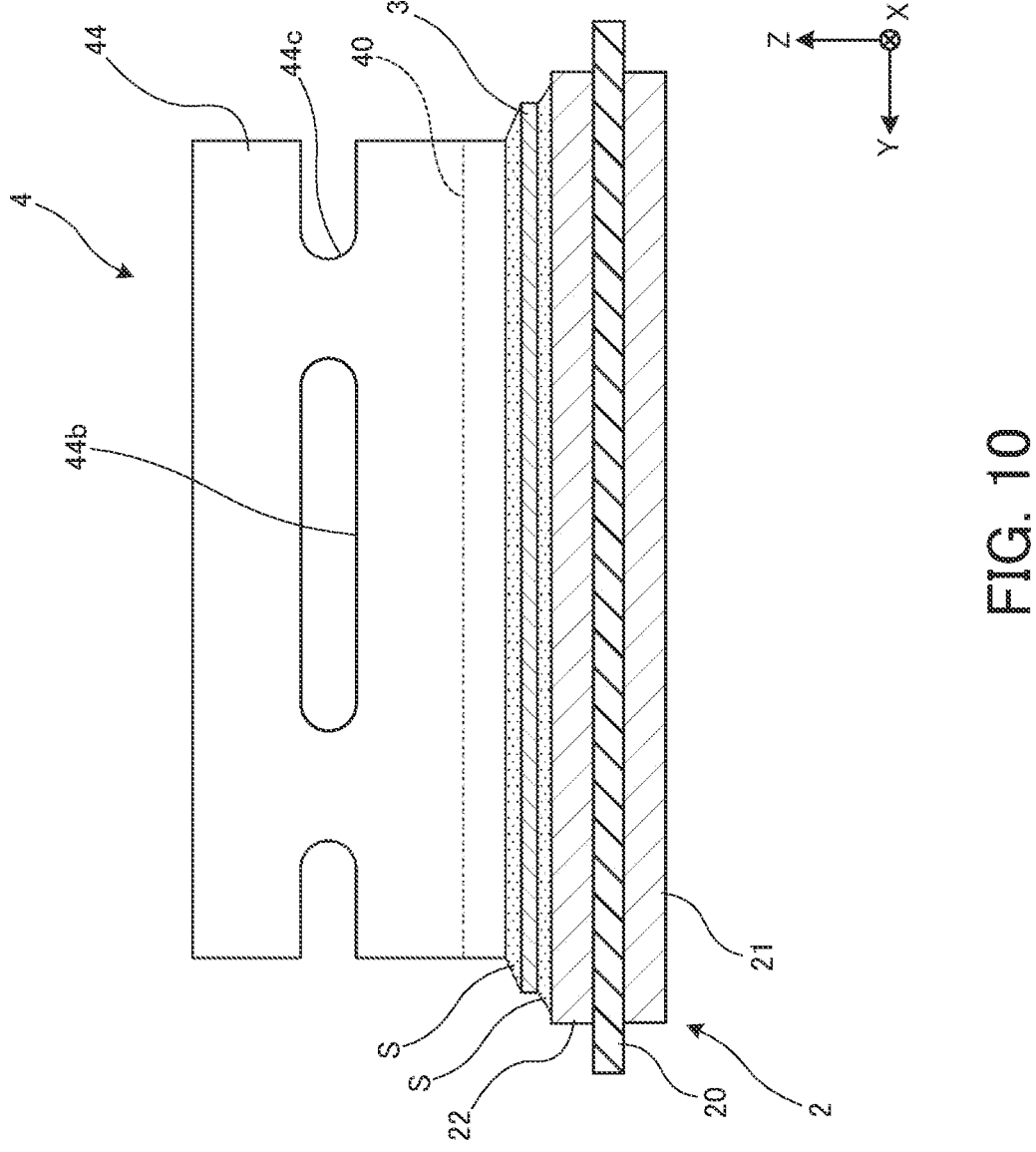
FIG. 10 is a schematic view illustrating a modification example of a penetrating portion formed on a surface of the metal wiring board.
Figure 11A:
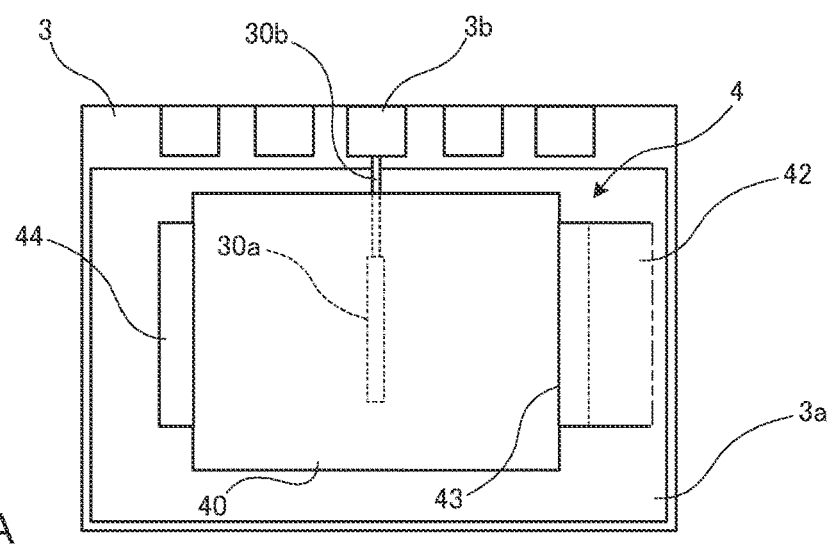
FIGS. 11A to 11C are schematic views illustrating variations of the metal wiring board.
Figure 11B:
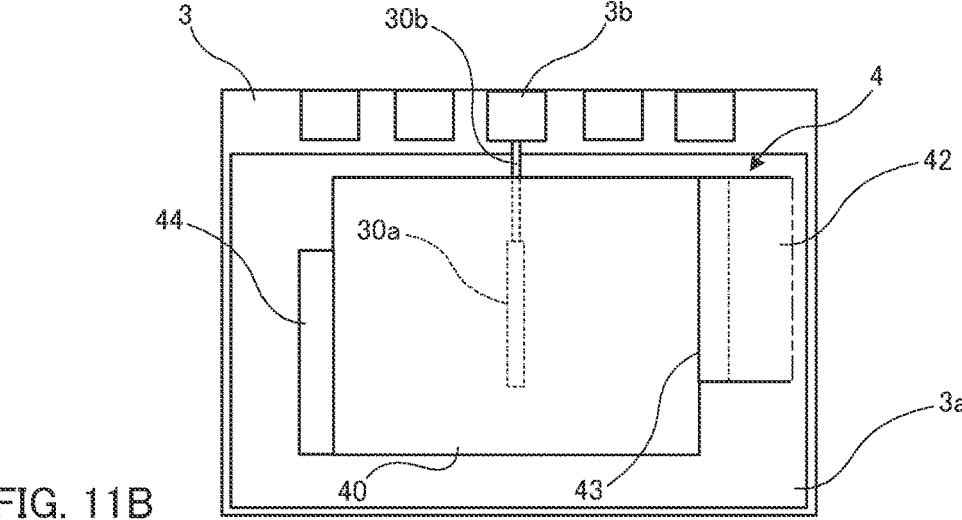
Figure 11C:
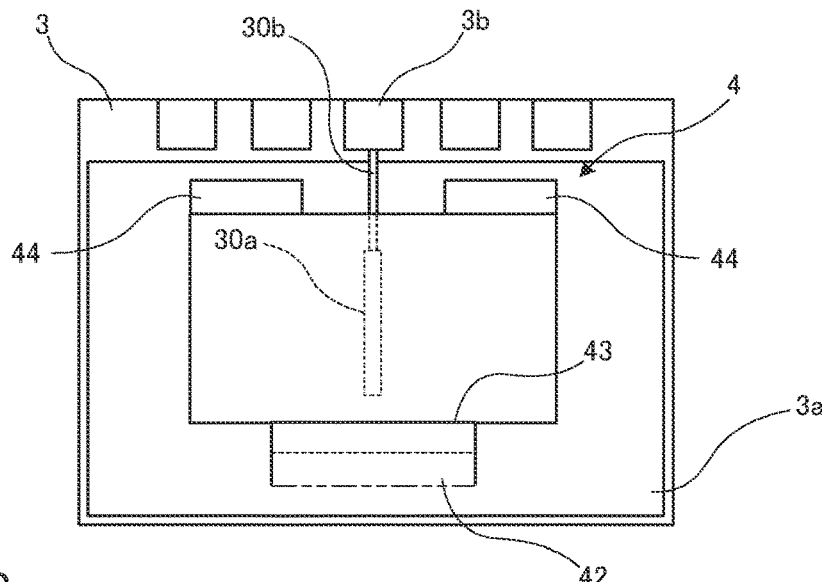

Next, modification examples will be described with reference to FIGS. 10 to 13B. FIG. 10 is a schematic view illustrating a modification example of the penetrating portion formed on the surface of the metal wiring board. FIGS. 11A to 11C are schematic views illustrating variations of the metal wiring board. FIGS. 12A, 12B and 13A, 13B are schematic views illustrating other variations of the metal wiring board. Note that, in the following modification examples, the already described configurations are denoted by the same names and the same reference numerals, and the description thereof will be omitted as appropriate.

In the above-described embodiment, the case where the penetrating portion 44b is formed of a circular penetrating hole as illustrated in FIG. 5 has been described, but the present invention is not limited to this configuration. For example, a configuration illustrated in FIG. 10 may be adopted. In FIG. 10, a penetrating portion 44b having a long hole shape elongated in the Y direction is formed at the center of the second standing portion 44. In addition, notches are formed as other penetrating portions 44c at both ends of the second standing portion 44. The notch portion extends from the edge portion of the second standing portion 44 in the Y direction toward the center in the Y direction. By filling the penetrating portions 44b and 44c with the sealing resin 5, the anchor effect of the second standing portion 44 in the Z direction can be increased. In addition, the penetrating portions 44b and 44c can also be applied to the first standing portion 43.

In addition, in the above-described embodiment, the case where the sense wiring 30*b* formed on the upper surface of the semiconductor element 3 and the second standing portion 44 are arranged to overlap each other in the plan view has been described, but the present invention is not limited to this configuration. For example, configurations illustrated in FIGS. 11A to 12B can also be adopted. In FIGS. 11A to 12B, the first standing portion 43 and the second standing portion 44 are formed on opposite sides of the rectangular first bonding portion 40.

In FIGS. 11A and 11B, the first standing portion 43 and the second standing portion 44 are arranged to face each other with the sense wiring 30*b* interposed therebetween. That is, in FIGS. 11A and 11B, the sense wiring 30*b*, the first standing portion 43, and the second standing portion 44 may be arranged not to overlap each other in the plan view.

In addition, as illustrated in FIG. 11A, the first standing portion 43 and the second standing portion 44 may be arranged to face toward each other with the temperature sensing portion 30*a* interposed therebetween. That is, the first standing portion 43 and the second standing portion 44 may be arranged line-symmetrically with respect to the temperature sensing portion 30*a*.

In addition, as illustrated in FIG. 11B, the first standing portion 43 and the second standing portion 44 may be arranged to face each other obliquely with the temperature sensing portion 30*a* interposed therebetween. That is, the first standing portion 43 and the second standing portion 44 may be arranged point-symmetrically with respect to the temperature sensing portion 30*a*.

In addition, as illustrated in FIG. 11C, while one first standing portion 43 is provided, two second standing portions 44 may be arranged at opposite portions thereto. In this case, the sense wiring 30*b* may be positioned between the two second standing portions 44. In this case, the sense wiring 30*b* and the second standing portion 44 do not overlap each other in the plan view. In addition, the total width of the two second standing portions 44 may be equal to or larger than the width of the first standing portion 43.

Figure 12A:
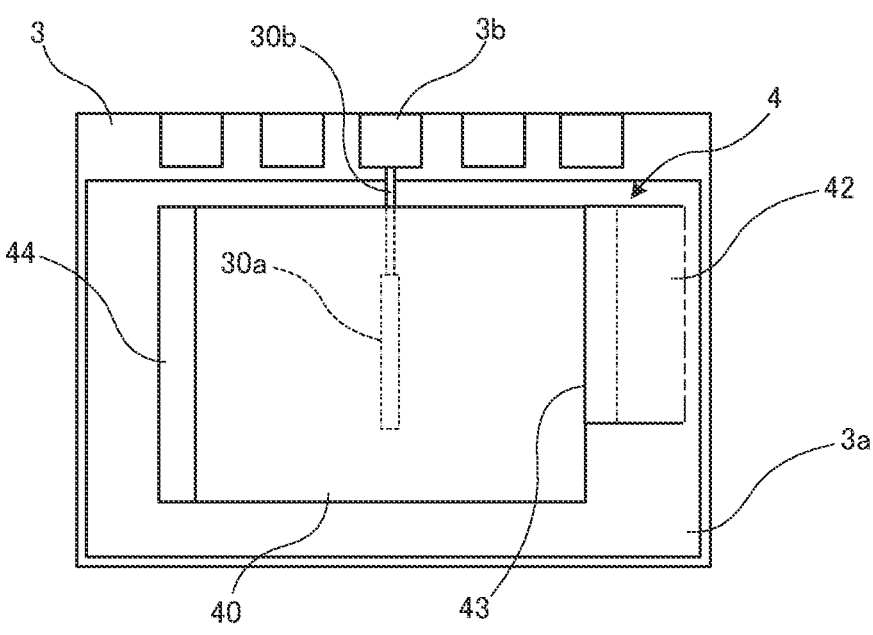
FIGS. 12A and 12B are schematic views illustrating other variations of the metal wiring board.

The width of the first standing portion 43 and the width of the second standing portion 44 may be different. As illustrated in FIG. 12A, the width of the second standing portion 44 may be longer than that of the first standing portion 43. The width of the second standing portion 44 may be the same as the width of the first bonding portion 40, and the width of the first standing portion 43 may be smaller than the width of the first bonding portion 40.

Figure 12B:
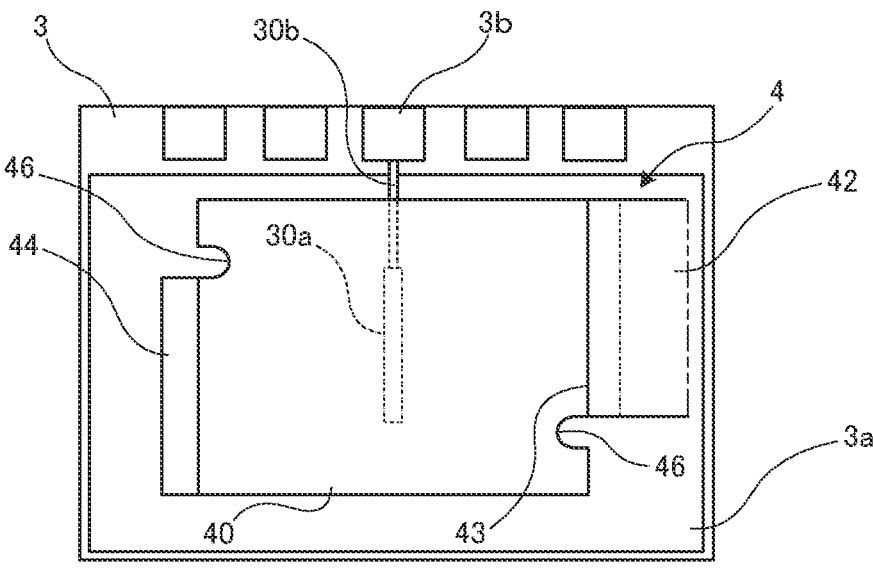

In addition, as illustrated in FIG. 12B, notches 46 may be formed at a proximal end of the first standing portion 43 and a proximal end of the second standing portion 44, respectively, according to the configuration of FIG. 11B described above. That is, the notch 46 is formed at an end portion of the first bonding portion 40 to which a lower end of the first standing portion 43 is connected. Similarly, the notch 46 is formed at an end portion of the first bonding portion 40 to which a lower end of the second standing portion 44 is connected.

The two notches 46 may be arranged to face each other obliquely with the temperature sensing portion 30*a* interposed therebetween. That is, the two notches 46 may be arranged point-symmetrically with respect to the temperature sensing portion 30*a*. According to these configurations, the stress on the first bonding portion 40 by each standing portion (the first standing portion 43 and the second standing portion 44) is relaxed, and it is possible to make it difficult for the first bonding portion 40 to peel off from the upper surface of the semiconductor element 3.

In addition, in the above-described embodiment, the case where the second standing portion 44 stands at a right angle with respect to the first bonding portion 40 has been described, but the present invention is not limited to this configuration. The second standing portion 44 may be inclined with respect to the first bonding portion 40. For example, the second standing portion 44 may stand (may bend) to form an acute angle or an obtuse angle with respect to the first bonding portion 40.

Figure 13A:
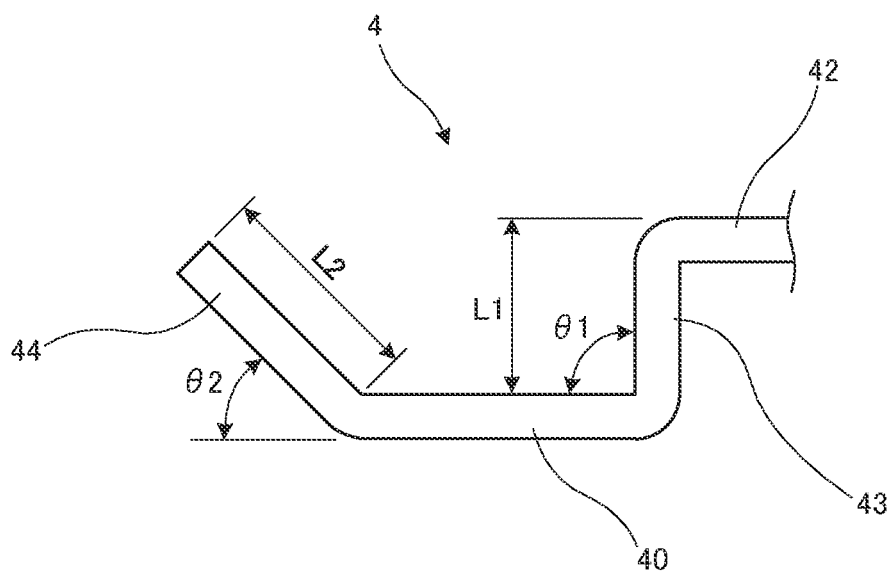
FIGS. 13A and 13B are schematic views illustrating other variations of the metal wiring board.
Figure 13B:
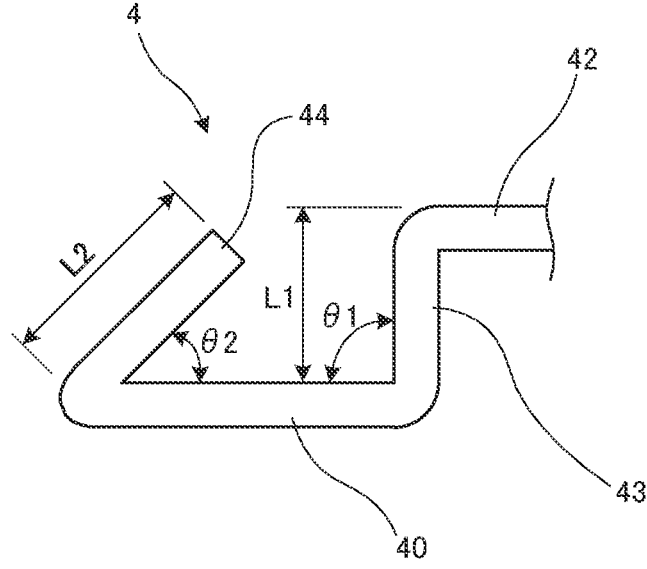

Specifically, as illustrated in FIGS. 13A and 13B, an angle formed by the first bonding portion 40 and the first standing portion 43 is represented by θ1, and an angle formed by the first bonding portion 40 and the second standing portion 44 is represented by θ2. In this case, θ2<θ1 is preferably satisfied. In this case, the upper end of the second standing portion 44 may be positioned lower than the first standing portion 43. In addition, a length L1 (a difference in height between the first bonding portion 40 and the connecting portion 42) of the first standing portion 43 is preferably longer than a length L2 of the second standing portion 44.

According to this configuration, when the width of the first standing portion 43 is the same as the width of the second standing portion 44, the surface area of the second standing portion 44 can be made larger than the surface area of the first standing portion 43. Accordingly, the contact area with the sealing resin 5 can be made larger in the second standing portion 44 than in the first standing portion 43, and the anchor effect can be further increased. That is, the surface area of the second standing portion 44 is preferably larger than the surface area of the first standing portion 43.

In addition, in the above-described embodiment, the case where the plurality of recesses 40*c* are arranged in a lattice shape with an equal pitch in the plan view has been described, but the present invention is not limited to this configuration. For example, the plurality of recesses 40*c* may be arranged in a staggered manner. Here, the staggered arrangement refers to an arrangement in which a row of recesses 40*c* is formed by the plurality of recesses 40*c* arranged in a predetermined direction (for example, the X direction), and the row of the recesses 40*c* is shifted by a half pitch (½ P) with respect to another adjacent row of recesses 40*c*. In the staggered arrangement, the rows of the plurality of recesses 40*c* are shifted with respect to each other by a half pitch. A similar arrangement to the recesses 40*c* may be applied to the recesses 43*a* and the recesses 44*a*.

Figure 14:
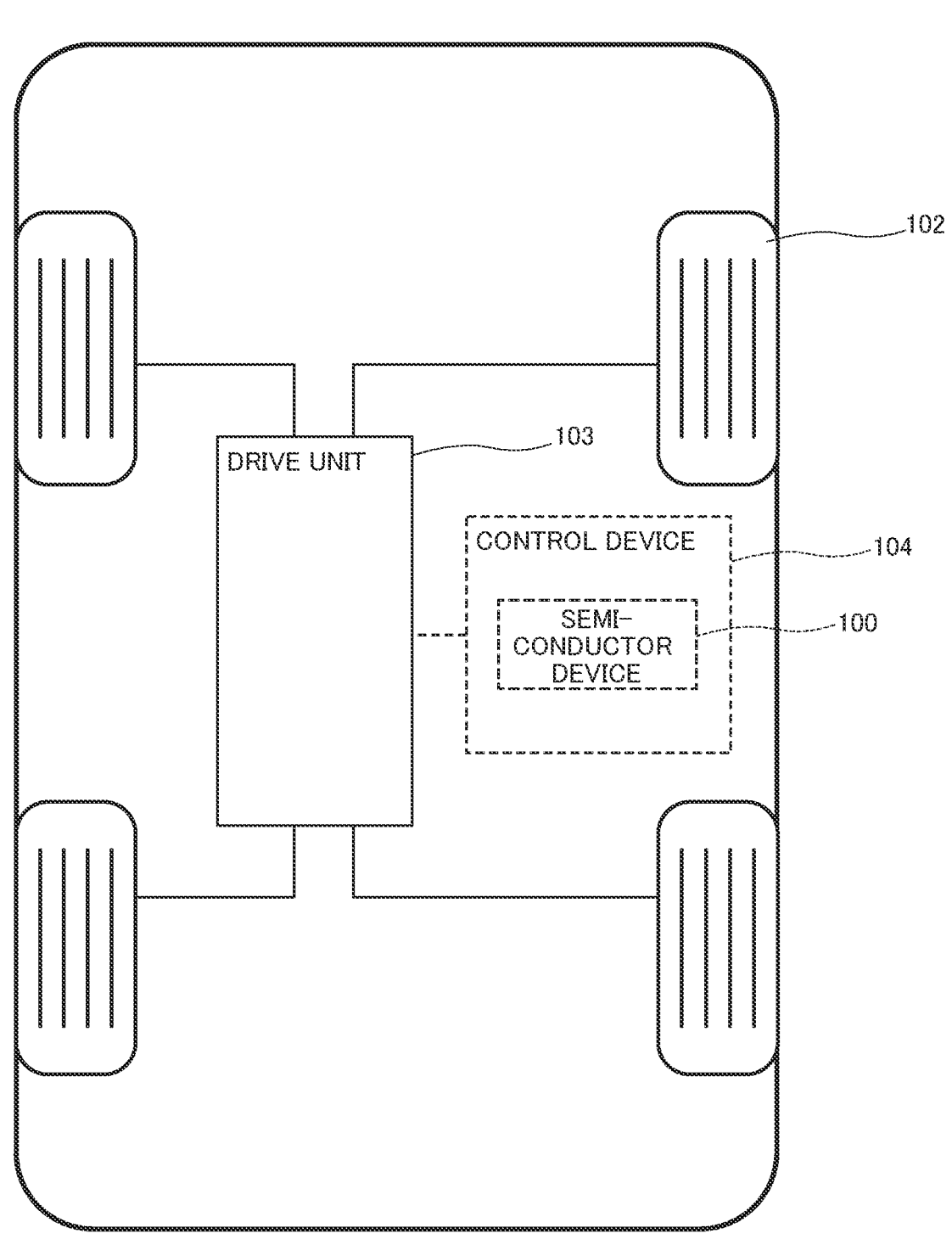
FIG. 14 is a schematic plan view illustrating an example of a vehicle to which the semiconductor device according to the present invention is applied.

A vehicle to which the present invention is applied will be described with reference to FIG. 14. FIG. 14 is a schematic plan view illustrating an example of the vehicle to which the semiconductor device according to the present invention is applied. A vehicle 101 illustrated in FIG. 14 includes, for example, a four-wheeled vehicle including four wheels 102. The vehicle 101 may be, for example, an electric vehicle that drives wheels by a motor or the like, or a hybrid vehicle using power of an internal combustion engine in addition to the motor.

The vehicle 101 includes a drive unit 103 which applies power to the wheels 102 and a control device 104 which controls the drive unit 103. The drive unit 103 may include, for example, at least one of an engine, the motor, and a hybrid of the engine and the motor.

The control device 104 performs control (for example, power control) of the drive unit 103 described above. The control device 104 includes the semiconductor device 100 described above. The semiconductor device 100 may be configured to perform power control on the drive unit 103.

In the above-described embodiment, the number and placement of the semiconductor element 3 are not limited to the above-described configuration, and can be changed as appropriate.

Furthermore, in the above-described embodiment, the number and layout of the circuit board are not limited to the above-described configuration, and can be changed as appropriate.

In the above-described embodiment, the stacked substrate 2 and the semiconductor element 3 are formed in a rectangular shape or a square shape in the plan view, but the present invention is not limited to this configuration. These configurations may be formed in a polygonal shape other than the above.

The present embodiment and the modification examples have been described, but as another embodiment, the above-described embodiment and modification examples may be wholly or partially combined.

Furthermore, the present embodiment is not limited to the above-described embodiment and modification examples, and various changes, substitutions, and modifications may be made without departing from the spirit of the technical idea. When the technical idea can be realized in another manner by the progress of the technology or another derived technology, the technology may be implemented by using the manner. Thus, the claims cover all implementations that may be included within the scope of the technical idea.

Feature points in the embodiments described above will be summarized below.

A semiconductor module according to the above-described embodiment includes: a stacked substrate in which a first circuit board is arranged on an upper surface of an insulating plate; a semiconductor element arranged on an upper surface of the first circuit board; a metal wiring board including a first bonding portion bonded to an upper surface of the semiconductor element with a bonding material; and a sealing resin that seals the stacked substrate, the semiconductor element, and the metal wiring board, the first bonding portion includes a plate-shaped portion having an upper surface and a lower surface, the metal wiring board includes a first standing portion standing up from one end of the first bonding portion, and a second standing portion standing up from the other end of the first bonding portion, the first standing portion constitutes a part of a wiring path through which a main current flows, and the second standing portion constitutes a non-wiring path through which the main current does not flow.

In the semiconductor module according to the above-described embodiment, the first standing portion and the second standing portion are arranged to face each other.

In the semiconductor module according to the above-described embodiment, a surface area of the second standing portion is larger than a surface area of the first standing portion.

In the semiconductor module according to the above-described embodiment, an upper end of the second standing portion is positioned higher than the first standing portion.

In the semiconductor module according to the above-described embodiment, a width of the second standing portion is equal to or larger than a width of the first standing portion in the plan view.

In the semiconductor module according to the above-described embodiment, the first standing portion and/or the second standing portion stand at a right angle with respect to the first bonding portion.

In the semiconductor module according to the above-described embodiment, the second standing portion is inclined with respect to the first bonding portion, and an angle formed by the first bonding portion and the second standing portion is smaller than an angle formed by the first bonding portion and the first standing portion.

In the semiconductor module according to the above-described embodiment, an upper end of the second standing portion is positioned lower than the first standing portion.

In the semiconductor module according to the above-described embodiment, a plurality of recesses is formed on an inner side surface of the second standing portion.

In the semiconductor module according to the above-described embodiment, the plurality of recesses is also formed on an upper surface of the first bonding portion and an inner side surface of the first standing portion.

In the semiconductor module according to the above-described embodiment, the second standing portion has a penetrating portion penetrating therethrough in a thickness direction, and the penetrating portion is filled with the sealing resin.

In the semiconductor module according to the above-described embodiment, the penetrating portion is formed of a hole or a notch.

In the semiconductor module according to the above-described embodiment, a second circuit board independent of the first circuit board is formed on the upper surface of the insulating plate, and the metal wiring board further has a second bonding portion bonded to an upper surface of the second circuit board with a bonding material, a third standing portion standing up from one end of the second bonding portion, and a connecting portion connecting an upper end of the first standing portion and an upper end of the third standing portion.

In the semiconductor module according to the above-described embodiment, the semiconductor element has a temperature sensing portion arranged on the upper surface, and a sense wiring electrically connected to the temperature sensing portion, the sense wiring extends from the temperature sensing portion toward an outer edge of the semiconductor element on the upper surface of the semiconductor element, and the sense wiring and the first standing portion and/or the second standing portion are provided to overlap each other in the plan view.

In the semiconductor module according to the above-described embodiment, the semiconductor element has a temperature sensing portion arranged on the upper surface, and a sense wiring electrically connected to the temperature sensing portion, the sense wiring extends from the temperature sensing portion toward an outer edge of the semiconductor element on the upper surface of the semiconductor element, and the sense wiring and the first standing portion and/or the second standing portion are provided not to overlap each other in the plan view.

In the semiconductor module according to the above-described embodiment, a boss protruding toward the semiconductor element is formed on the lower surface of the first bonding portion, and another recess larger than the recess is formed at a position corresponding to immediately above the boss on the upper surface of the first bonding portion.

A semiconductor device according to the above-described embodiment includes: the semiconductor module; and a cooler arranged on a lower surface of the stacked substrate.

A vehicle according to the above-described embodiment includes the semiconductor module or the semiconductor device.

INDUSTRIAL APPLICABILITY

As described above, the present invention has the effect of improving the bonding strength between the semiconductor element and the metal wiring board while securing the thickness of the bonding material, and is particularly useful for a semiconductor module for industrial or electrical equipment, a semiconductor device, and a vehicle.

The present application is based on Japanese Patent Application No. 2021-210859 filed on Dec. 24, 2021. All the contents are included here.

What is claimed is:

1. A semiconductor module, comprising:
a stacked substrate including an insulating plate and a first circuit board arranged on an upper surface of the insulating plate;
a semiconductor element arranged on an upper surface of the first circuit board;
a metal wiring board including a first bonding portion bonded to an upper surface of the semiconductor element with a bonding material; and
a sealing resin that seals the stacked substrate, the semiconductor element and the metal wiring board, wherein
the first bonding portion has an upper surface and a lower surface opposite to each other and includes a plate-shaped portion,
the metal wiring board has
a first standing portion standing up from one end of the first bonding portion, and
a second standing portion standing up from the other end of the first bonding portion opposite to the one end in a first direction,
the first standing portion constitutes a part of a wiring path through which a main current of the semiconductor module flows, and
the second standing portion constitutes a non-wiring path through which the main current does not flow.

2. The semiconductor module according to claim 1, wherein the first standing portion and the second standing portion face each other.

3. The semiconductor module according to claim 1, wherein an entire surface area of the second standing portion is larger than an entire surface area of the first standing portion.

4. The semiconductor module according to claim 3, wherein an upper end of the second standing portion is positioned farther from the upper surface of the semiconductor than is an upper end of the first standing portion.

5. The semiconductor module according to claim 1, wherein in a second direction orthogonal to the first direction, a width of the second standing portion is equal to or larger than a width of the first standing portion in a plan view of the semiconductor module.

6. The semiconductor module according to claim 1, wherein the first bonding portion and one of the first standing portion or the second standing portion forms a right angle.

7. The semiconductor module according to claim 1, wherein
the second standing portion is inclined with respect to the first bonding portion, and
an angle formed by the first bonding portion and the second standing portion is smaller than an angle formed by the first bonding portion and the first standing portion.

8. The semiconductor module according to claim 7, wherein an upper end of the second standing portion is positioned closer to the upper surface of the semiconductor element than is an upper end of the first standing portion.

9. The semiconductor module according to claim 1, wherein an inner side surface of the second standing portion that faces the first standing portion has a plurality of first recesses.

10. The semiconductor module according to claim 9, wherein an upper surface of the first bonding portion and an inner side surface of the first standing portion that faces the second standing portion respectively have a plurality of second recesses.

11. The semiconductor module according to claim 1, wherein
the second standing portion has a penetrating portion penetrating therethrough in a thickness direction, and
the penetrating portion is filled with the sealing resin.

12. The semiconductor module according to claim 11, wherein the penetrating portion is a hole or a notch.

13. The semiconductor module according to claim 1, wherein
the stacked substrate includes a second circuit board arranged on the upper surface of the insulating plate, and
the metal wiring board further has
a second bonding portion bonded to an upper surface of the second circuit board with a bonding material,
a third standing portion standing up from one end of the second bonding portion, and
a connecting portion connecting an upper end of the first standing portion and an upper end of the third standing portion to electrically connect the semiconductor element to the second circuit board.

14. The semiconductor module according to claim 1, wherein
the semiconductor element has
a temperature sensing portion arranged on the upper surface thereof, and
a sense wiring electrically connected to the temperature sensing portion, and extending from the temperature sensing portion toward an outer edge of the semiconductor element on the upper surface of the semiconductor element, and
the sense wiring overlaps the first standing portion and/or the second standing portion in a plan view of the semiconductor module.

15. The semiconductor module according to claim 1, wherein
the semiconductor element has
a temperature sensing portion arranged on the upper surface, and
a sense wiring electrically connected to the temperature sensing portion, and extending from the temperature sensing portion toward an outer edge of the semiconductor element on the upper surface of the semiconductor element, and
the sense wiring does not overlap the first standing portion and/or the second standing portion in a plan view of the semiconductor module.

16. The semiconductor module according to claim 9, wherein
the first bonding portion has on the lower surface thereof a boss protruding toward the semiconductor element, and on the upper surface thereof a third recess formed at a position corresponding to immediately above the boss, at the upper surface of the first bonding portion, the third recess having an opening area that is larger than an opening area of each of the first recesses.

17. A semiconductor device comprising:

the semiconductor module according to claim 1; and a cooler arranged on a lower surface of the stacked substrate.

18. A vehicle comprising the semiconductor device according to claim 17.

19. A vehicle comprising the semiconductor module according to claim 1.

\* \* \* \* \*